United States Patent
Chen et al.

(10) Patent No.: US 9,948,280 B1
(45) Date of Patent: Apr. 17, 2018

(54) TWO-CAPACITOR-BASED FILTER DESIGN METHOD AND TWO-CAPACITOR-BASED FILTER

(71) Applicant: REALTEK SEMICONDUCTOR CORPORATION, Hsinchu (TW)

(72) Inventors: Po-Chun Chen, Yunlin County (TW); Ruey-Beei Wu, Taipei (TW); Ting-Ying Wu, Hsinchu County (TW); Wen-Shan Wang, Hsinchu County (TW); Gerchih Chou, San Jose, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/466,159

(22) Filed: Mar. 22, 2017

(51) Int. Cl.
*H03H 7/00* (2006.01)
*H03H 19/00* (2006.01)

(52) U.S. Cl.
CPC .................. *H03H 19/004* (2013.01)

(58) Field of Classification Search
CPC .................................................. H03H 19/004
See application file for complete search history.

(56) References Cited

U.S. PATENT DOCUMENTS

| | | | | |
|---|---|---|---|---|
| 5,191,304 A * | 3/1993 | Jachowski | ............ | H01P 1/2084 333/202 |
| 5,963,112 A * | 10/1999 | Moschytz | ............ | H03H 11/126 327/552 |
| 6,096,090 A * | 8/2000 | Guglielmi | ............... | H01P 1/207 333/202 |
| 6,326,863 B1 * | 12/2001 | Kushitani | ............. | H01P 1/2039 333/126 |
| 6,617,941 B2 * | 9/2003 | Heumann | ................ | H03H 7/06 333/167 |
| 8,106,728 B2 * | 1/2012 | Ding | ....................... | H01P 1/203 333/176 |
| 9,786,973 B2 * | 10/2017 | Cherif | ................... | H01P 1/2039 |
| 2010/0267354 A1 * | 10/2010 | Mirzaei | ............... | H03D 7/1458 455/307 |
| 2010/0289567 A1 * | 11/2010 | Iida | ....................... | H03H 15/00 327/554 |

* cited by examiner

*Primary Examiner* — Kenneth B Wells
(74) *Attorney, Agent, or Firm* — WPAT, PC (57) ABSTRACT

Disclosed is a two-capacitor-based filter design method comprising: determining a frequency $f_1$ and a fractional bandwidth ratio FBW; selecting a first and a second capacitors according to $f_1$ and FBW, in which a resonant frequency $f_{C1}$ of the first capacitor is equal to $f_1 \times (1-N \times FBW)$, a resonant frequency $f_{C2}$ of the second capacitor is equal to $f_1 \times (1+M \times FBW)$, and each of N and M is a positive number less than one; and determining a length of a first transmission line according to $f_{C1}$ and a signal speed, and determining a length of a second transmission line according to $f_{C2}$ and the signal speed. The first capacitor is coupled between a center of the first transmission line and ground, the second capacitor is coupled between a center of the second transmission line and ground, and the first and second transmission lines are connected in series.

10 Claims, 6 Drawing Sheets

TWO-CAPACITOR-BASED FILTER DESIGN METHOD AND TWO-CAPACITOR-BASED FILTER

BACKGROUND OF THE INVENTION

1. Field of the Invention

The present invention relates to a filter, especially to a filter with designed capacitors and transmission lines.

2. Description of Related Art

In circuit design, one or more capacitor(s) is/are coupled between a transmission line of a power/ground trace and a grounding terminal to filter noise. However, the correlation between characteristics of the capacitor(s) and the transmission line is not specifically designated, so that such filtering design is empirical and can only work under a low frequency band (e.g., hundreds of MHz) or provide a narrow filtering bandwidth.

SUMMARY OF THE INVENTION

In consideration of the problems of the prior art, an object of the present invention is to provide a two-capacitor-based (two-cap-based) filter design method and a two-cap-based filter for making improvements over the prior art.

An embodiment of the two-cap-based filter design method of the present invention comprises the following steps: determining a reference frequency and a ratio of a fraction to a filtering bandwidth, in which the fraction is a part of the filtering bandwidth and the reference frequency is within the fraction; selecting a first capacitor and a second capacitor according to the reference frequency and the ratio, in which a resonant frequency of the first capacitor is equal to the reference frequency minus the reference frequency multiplied by N times the ratio, a resonant frequency of the second capacitor is equal to the reference frequency plus the reference frequency multiplied by M times the ratio, and each of the N and the M is a positive number not greater than one; and determining a length of a first transmission line according to the resonant frequency of the first capacitor and a signal transmission speed, and determining a length of a second transmission line according to the resonant frequency of the second capacitor and the signal transmission speed, wherein the first capacitor is coupled between a center of the first transmission line and a voltage terminal, the second capacitor is coupled between a center of the second transmission line and the voltage terminal, the first transmission line is coupled between a signal input terminal and the second transmission line, and the second transmission line is coupled between the first transmission line and a signal output terminal or the second transmission line is coupled between the first transmission line and another transmission line.

An embodiment of the two-cap-based filter of the present invention comprises: a first capacitor having a resonant frequency equal to a reference frequency minus the reference frequency multiplied by N times a ratio of a fraction to a filtering bandwidth, in which the N is a positive number not greater than one; a second capacitor having a resonant frequency equal to the reference frequency plus the reference frequency multiplied by M times the ratio, in which the M is a positive number not greater than one; a first transmission line having a length less than one-fourth of a signal transmission speed divided by the resonant frequency of the first capacitor; and a second transmission line having a length less than the one-fourth of the signal transmission speed divided by the resonant frequency of the second capacitor. In addition, the first capacitor is coupled between a center of the first transmission line and a voltage terminal, the second capacitor is coupled between a center of the second transmission line and the voltage terminal, the first transmission line is coupled between a signal input terminal and the second transmission line, and the second transmission line is coupled between the first transmission line and a signal output terminal or the second transmission line is coupled between the first transmission line and another transmission line.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms acknowledged in this industrial field. If any term is defined in this specification, such a term should be explained accordingly.

Figure 1:
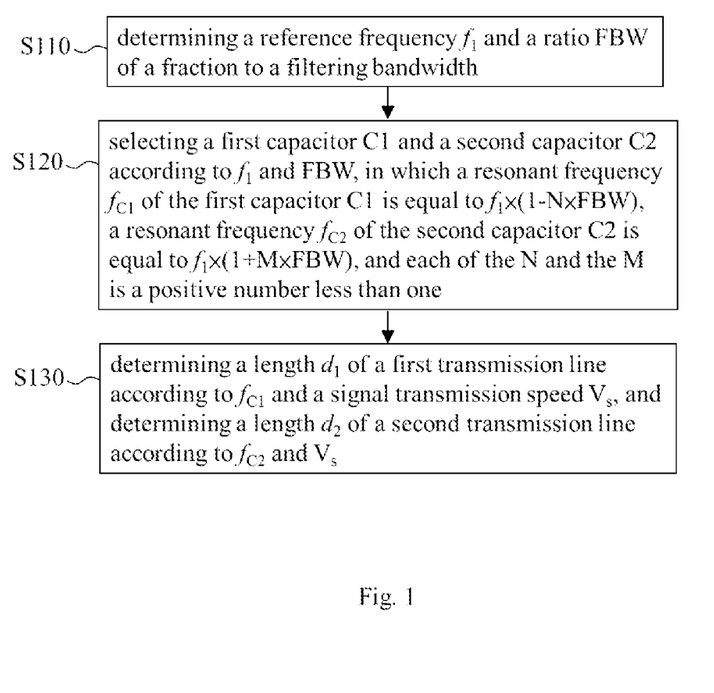
FIG. 1 illustrates an embodiment of the two-capacitor-based filter design method of the present invention.
Figure 2:
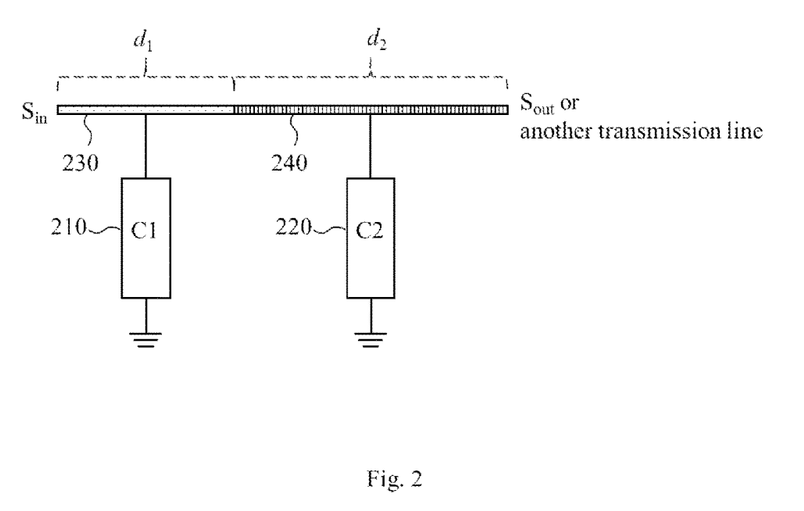
FIG. 2 illustrates an embodiment of the two-capacitor-based filter of the present invention.
Figure 6:
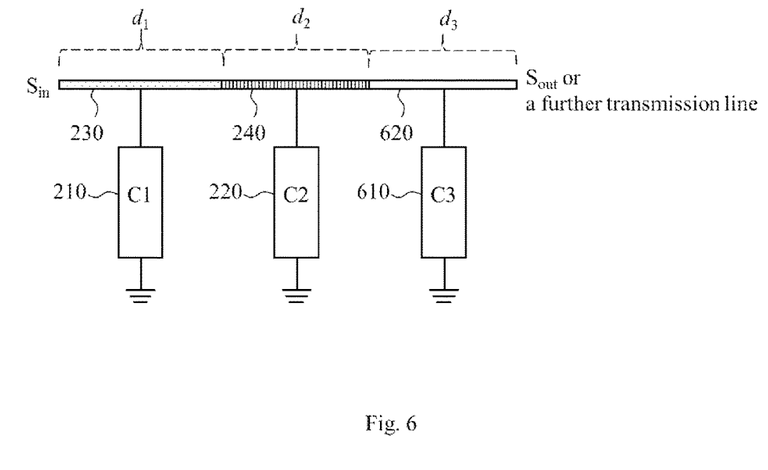
FIG. 6 illustrates another embodiment of the two-capacitor-based filter of the present invention.

The present disclosure includes a two-capacitor-based (two-cap-based) filter design method and a two-cap-based filter. FIG. 1 and FIG. 2 show the embodiments of the two-cap-based filter design method and the two-cap-based filter respectively. As shown in FIG. 1, the two-capacitor-based filter design method comprises the following steps:

step S110: determining a reference frequency $f_1$ and a ratio FBW of a fraction to a filtering bandwidth. In this embodiment, $f_1$ and FBW are determined in accordance with one or more given design specification(s); in other embodiments, $f_1$ and FBW could be determined in accordance with circuit designer's demands. It should be noted that the fraction is a part of the filtering bandwidth and the reference frequency $f_1$ is within the fraction.

step S120: selecting a first capacitor C1 (e.g., the capacitor 210 in FIG. 2) and a second capacitor C2 (e.g., the capacitor 220 in FIG. 2) according to the reference frequency $f_1$ and the ratio FBW, in which a resonant frequency $f_{C1}$ of the first capacitor C1 is equal to the reference frequency $f_1$ minus the reference frequency $f_1$ multiplied by N times the ratio FBW (i.e., $f_{C1}=f_1\times(1-N\times FBW)$), and a resonant frequency $f_{C2}$ of the second capacitor C2 is equal to the reference frequency $f_1$ plus the reference frequency $f_1$ multiplied by M times the ratio FBW (i.e., $f_{C2}=f_1\times(1+M\times FBW)$). Each of the said N and the M is a positive number not greater than one, and the N and the M can be the same or different. When the N and the M are the same, $f_1$ is the average of $f_{C1}$ and $f_{C2}$.

step S130: determining a length $d_1$ of a first transmission line (e.g., the first transmission line 230 in FIG. 2) according to the resonant frequency $f_{C1}$ of the first capacitor C1 and a signal transmission speed $V_s$, and determining a length $d_2$ of a second transmission line (e.g., the second transmission line 240 in FIG. 2) according to the resonant frequency $f_{C2}$ of the second capacitor C2 and the signal transmission speed $V_s$, wherein the first capacitor C1 is coupled between a center of the first transmission line and a voltage terminal (e.g., the grounding terminal in FIG. 2), the second capacitor C2 is coupled between a center of the second transmission line and the voltage terminal, the first transmission line is coupled between a signal input terminal $S_{in}$ and the second transmission line, and the second transmission line is coupled between the first transmission line and a signal output terminal $S_{out}$ or the second transmission line is coupled between the first transmission line and another transmission line (e.g., the third transmission line 620 in FIG. 6).

Figure 3:
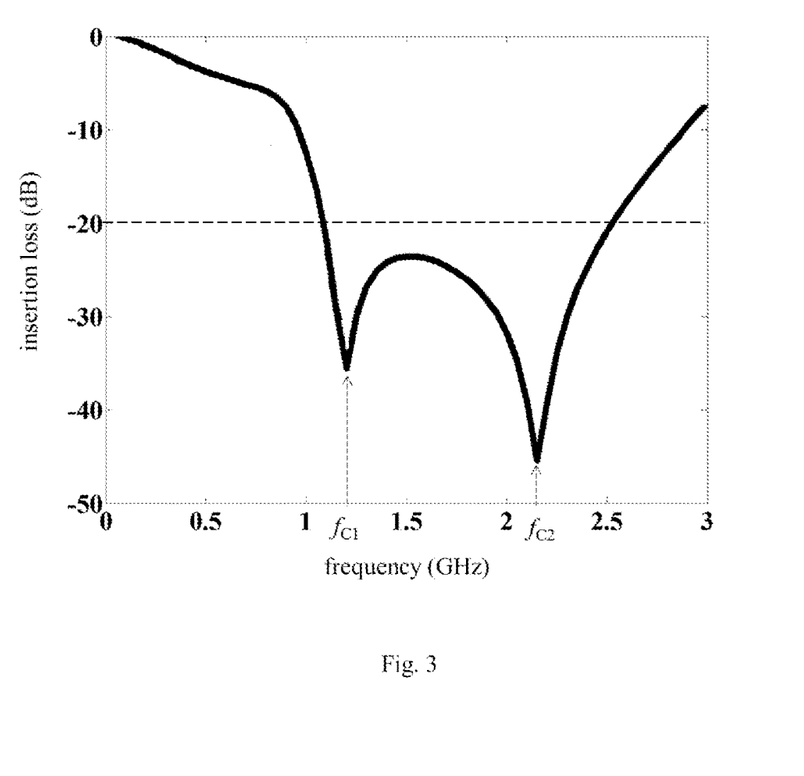
FIG. 3 illustrates an insertion loss of an input signal under the embodiments of FIGS. 1 and 2.

In light of the above, if $f_1$ is 1.75 GHz, FBW is 85%, N is ⅓ and M is ⅓, $f_{C1}$ approximates to 1.25 GHz (i.e., $f_{C1}=f_c\times(1-FBW\times N)=1.75\times(1-0.85/3)\sim1.25$ GHz) and $f_{C2}$ approximates to 2.25 GHz (i.e., $f_{C2}=f_c\times(1+FBW\times M)=1.75\times(1+0.85/3)\sim2.25$ GHz). Accordingly, since the signal transmission speed $V_s$ is close to the velocity of light, $d_1$ can be determined according to $f_{C1}$ and $V_s$, and $d_2$ can be determined according to $f_{C2}$ and $V_s$; for instance, $d_1$ can be determined according to $V_s/4$ divided by $f_{C1}$, and $d_2$ can be determined according to $V_s/4$ divided by $f_{C2}$. In a preferred embodiment of the present invention, $d_1$ is less than $V_s/(4f_{C1})$, and $d_2$ is less than $V_s/(4f_{C2})$; provided that $f_{C1}$ and $f_{C2}$ are the aforementioned 1.25 GHz and 2.25 GHz respectively, $d_1$ will be less than $V_s/(4f_{C1})=67.7$ mm (i.e., $d_1<67.7$ mm), and $d_2$ will be less than $V_s/(4f_{C2})=38$ mm (i.e., $d_2<38$ mm). In order to make a stopband (i.e., effective filtering bandwidth) defined by the combination of C1 and the first transmission line overlap a stopband defined by the combination of C2 and the second transmission line to achieve a wide and effective filtering bandwidth, $d_1$ and $d_2$ could be 18 mm and 20 mm respectively in this preferred embodiment; such setting of $d_1$ and $d_2$ is exemplary for understanding, not a limitation to the present invention. It should be noted that by properly selecting the reference frequency $f_1$ and the ratio FBW, the present invention is capable of making the reference frequency $f_1$ greater than 1 GHz and/or making a minimum frequency in the fraction greater than 1 GHz so as to realize a wide filtering bandwidth under a high-frequency band as shown in FIG. 3; this feature of the present invention is useful for modern electronic circuits while the prior art without specified capacitors and transmission lines can only work under a low frequency band (e.g., hundreds of MHz) or provide a narrow filtering bandwidth.

Figure 4:
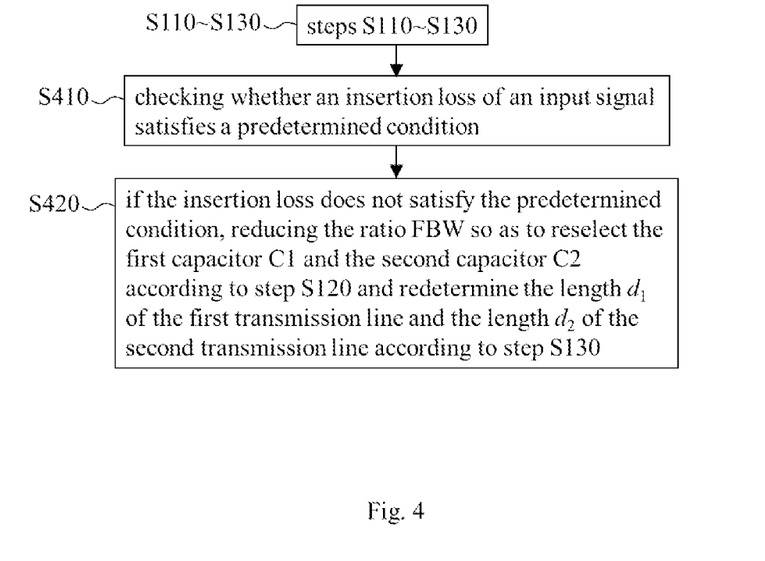
FIG. 4 illustrates another embodiment of the two-capacitor-based filter design method of the present invention.

To make sure the reference frequency $f_1$ and the ratio FBW are properly selected, the embodiment of the two-cap-based filter design method further comprises the following steps as shown in FIG. 4:

step S410: checking whether an insertion loss of an input signal satisfies a predetermined condition. For instance, if the insertion loss of the input signal below a predetermined threshold (e.g., −20 dB as shown in FIG. 3) covers a desired frequency band, the predetermined condition is satisfied.

step S420: if the insertion loss does not satisfy the predetermined condition, reducing the ratio FBW so as to reselect the first capacitor C1 and the second capacitor C2 according to step S120 and redetermine the length $d_1$ of the first transmission line and the length $d_2$ of the second transmission line according to step S130.

Figure 5:
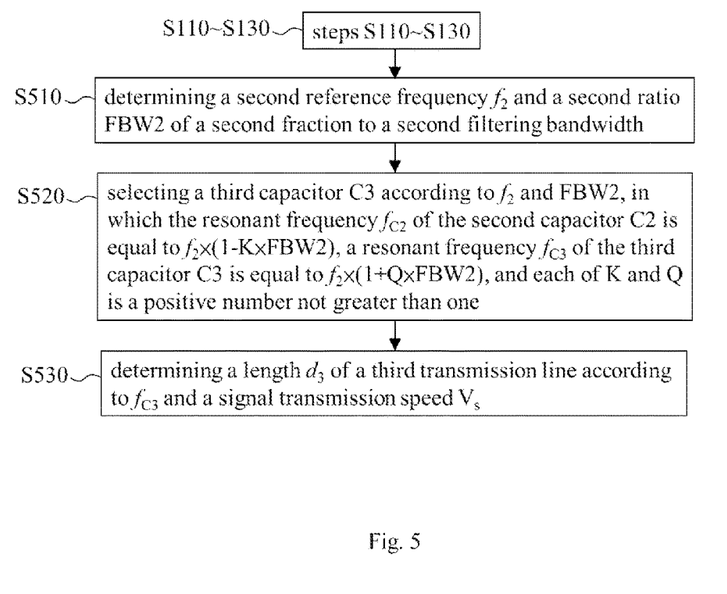
FIG. 5 illustrates a further embodiment of the two-capacitor-based filter design method of the present invention.

The present invention is capable of creating an even wider filtering bandwidth by incorporating more capacitors and transmission lines selected with the same or similar steps mentioned above. In this case, the embodiment of the two-cap-based filter design method further comprises the following steps as shown in FIG. 5:

step S510: determining a second reference frequency $f_2$ and a second ratio FBW2 of a second fraction to a second filtering bandwidth, in which the second fraction is a part of the second filtering bandwidth and the second reference frequency is within the second fraction.

step S520: selecting a third capacitor C3 (e.g., the capacitor 610 in FIG. 6) according to the second reference frequency $f_2$ and the second ratio FBW2, in which the resonant frequency $f_{C2}$ of the second capacitor C2 is equal to the second reference frequency $f_2$ minus the second reference frequency $f_2$ multiplied by K times the second ratio FBW2, and a resonant frequency $f_{C3}$ of the third capacitor C3 is equal to the second reference frequency $f_2$ plus the second reference frequency $f_2$ multiplied by Q times the second ratio FBW2. Each of the K and the Q is a positive number not greater than one, and the K and the Q could be the same or different. When the K and the Q are the same, $f_2$ is the average of $f_{C2}$ and $f_{C3}$.

step S530: determining a length $d_3$ of a third transmission line (e.g., the third transmission line 620 in FIG. 6) according to the resonant frequency $f_{C3}$ of the third capacitor C3 and the signal transmission speed $V_s$, wherein the third capacitor C3 is coupled between a center of the third transmission line and the voltage terminal, the second transmission line is coupled between the first transmission line and the third transmission line, and the third transmission line is coupled between the second transmission line and the signal output terminal $S_{out}$ or the third transmission line is coupled between the second transmission line and a further transmission line (not shown in the figure).

It should be noted that the foresaid way to determine $d_1$ and $d_2$ is applicable to the determination of $d_3$. For instance, $d_3$ is determined according to the one-fourth of the signal transmission speed $V_s$ divided by the resonant frequency $f_{C3}$ of the third capacitor C3; for another instance, $d_3$ is determined to be less than $V_s/(4f_{C3})$. It should be also noted that people of ordinary skill in the art can easily appreciate how to add more capacitors and transmission lines into the two-cap-based filter of the present invention by referring to the present disclosure.

FIGS. 2 and 6 show the embodiments of the two-cap-based filter of the present invention. The embodiment of FIG. 2 includes a first capacitor (C1) 210, a second capacitor (C2) 220, a first transmission line 230, and a second transmission line 240; and the embodiment of FIG. 6 further includes a third capacitor (C3) 610 and a third transmission line 620. Since those of ordinary skill in the art can appreciate the detail and modification of these embodiments by referring to the description of the fore-disclosed method embodiments, which implies that the features of the method embodiments can be reasonably applied to the embodiments of FIGS. 2 and 6, repeated and redundant explanation is therefore omitted.

In summary, the two-cap-based filter design method and the two-cap-based filter of the present disclosure can achieve a wide filtering bandwidth under a high-frequency band in an uncomplicated and cost-effective way.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A two-capacitor-based filter design method, comprising:
   determining a reference frequency and a ratio of a fraction to a filtering bandwidth, in which the fraction is a part of the filtering bandwidth and the reference frequency is within the fraction;
   selecting a first capacitor and a second capacitor according to the reference frequency and the ratio, in which a resonant frequency of the first capacitor is equal to the reference frequency minus the reference frequency multiplied by N times the ratio, a resonant frequency of the second capacitor is equal to the reference frequency plus the reference frequency multiplied by M times the ratio, and each of the N and the M is a positive number not greater than one; and
   determining a length of a first transmission line according to the resonant frequency of the first capacitor and a signal transmission speed, and determining a length of a second transmission line according to the resonant frequency of the second capacitor and the signal transmission speed,
   wherein the first capacitor is coupled between a center of the first transmission line and a voltage terminal, the second capacitor is coupled between a center of the second transmission line and the voltage terminal, the first transmission line is coupled between a signal input terminal and the second transmission line, and the second transmission line is coupled between the first transmission line and a signal output terminal or the second transmission line is coupled between the first transmission line and a third transmission line.

2. The method of claim 1, further comprising: checking whether an insertion loss of an input signal in the fraction of the filtering bandwidth satisfies a predetermined condition; and if the insertion loss does not satisfy the predetermined condition, reducing the ratio so as to reselect the first capacitor and the second capacitor and redetermine the length of the first transmission line and the length of the second transmission line, in which a transmission speed of the input signal is equal to the signal transmission speed.

3. The method of claim 1, wherein the step of determining the length of the first transmission line and the length of the second transmission line includes: dividing one-fourth of the signal transmission speed by the resonant frequency of the first capacitor to determine the length of the first transmission line; and dividing the one-fourth of the signal transmission speed by the resonant frequency of the second capacitor to determine the length of the second transmission line.

4. The method of claim 3, wherein the length of the first transmission line is less than the one-fourth of the signal transmission speed divided by the resonant frequency of the first capacitor; and the length of the second transmission line is less than the one-fourth of the signal transmission speed divided by the resonant frequency of the second capacitor.

5. The method of claim 1, wherein the reference frequency is greater than 1 GHz and/or a minimum frequency in the fraction is greater than 1 GHz.

6. The method of claim 1, further comprising:
   determining a second reference frequency and a second ratio of a second fraction to a second filtering bandwidth, in which the second fraction is a part of the second filtering bandwidth and the second reference frequency is within the second fraction;
   selecting a third capacitor according to the second reference frequency and the second ratio, in which the resonant frequency of the second capacitor is equal to the second reference frequency minus the second reference frequency multiplied by K times the second ratio, a resonant frequency of the third capacitor is equal to the second reference frequency plus the second reference frequency multiplied by Q times the second ratio, and each of the K and the Q is a positive number not greater than one; and
   determining a length of the third transmission line according to the resonant frequency of the third capacitor and the signal transmission speed,
   wherein the third capacitor is coupled between a center of the third transmission line and the voltage terminal, the second transmission line is coupled between the first transmission line and the third transmission line, and the third transmission line is coupled between the second transmission line and the signal output terminal or the third transmission line is coupled between the second transmission line and another transmission line.

7. The method of claim 6, wherein the length of the third transmission line is less than the one-fourth of the signal transmission speed divided by the resonant frequency of the third capacitor.

8. A two-capacitor-based filter, comprising:
   a first capacitor having a resonant frequency equal to a reference frequency minus the reference frequency multiplied by N times a ratio of a fraction to a filtering bandwidth, in which the N is a positive number not greater than one;
   a second capacitor having a resonant frequency equal to the reference frequency plus the reference frequency multiplied by M times the ratio, in which the M is a positive number not greater than one;
   a first transmission line having a length less than one-fourth of a signal transmission speed divided by the resonant frequency of the first capacitor; and
   a second transmission line having a length less than the one-fourth of the signal transmission speed divided by the resonant frequency of the second capacitor,
   wherein the first capacitor is coupled between a center of the first transmission line and a voltage terminal, the second capacitor is coupled between a center of the second transmission line and the voltage terminal, the first transmission line is coupled between a signal input terminal and the second transmission line, and the second transmission line is coupled between the first transmission line and a signal output terminal or the second transmission line is coupled between the first transmission line and a third transmission line.

9. The two-capacitor-based filter of claim 8, further comprising:
   a third capacitor having a resonant frequency equal to a second reference frequency plus the second reference frequency multiplied by Q times a second ratio of a second fraction to a second filtering bandwidth, in which the Q is a positive number not greater than one, the second fraction is a part of the second filtering bandwidth and the second reference frequency is within the second fraction; and a third transmission line having a length less than the one-fourth of the signal transmission speed divided by the resonant frequency of the third capacitor, wherein the third capacitor is coupled between a center of the third transmission line and the voltage terminal, the second transmission line is coupled between the first transmission line and the third transmission line, and the third transmission line is coupled between the second transmission line and the signal output terminal or the second transmission line is coupled between the second transmission line and another transmission line.

10. The two-capacitor-based filter of claim 8, wherein the reference frequency is greater than 1 GHz and/or a minimum frequency in the fraction is greater than 1 GHz.

* * * * *